United States Patent
Gong et al.

(10) Patent No.: US 10,083,912 B2
(45) Date of Patent: Sep. 25, 2018

(54) METHOD OF PACKAGING INTEGRATED CIRCUIT DIE AND DEVICE

(71) Applicant: FREESCALE SEMICONDUCTOR, INC., Austin, TX (US)

(72) Inventors: Zhiwei Gong, Tempe, AZ (US); Wei Gao, Tianjin (CN)

(73) Assignee: NXP USA, INC., Austin, TX (US)

( * ) Notice: Subject to any disclaimer, the term of this patent is extended or adjusted under 35 U.S.C. 154(b) by 81 days.

(21) Appl. No.: 15/041,026

(22) Filed: Feb. 10, 2016

(65) Prior Publication Data
US 2017/0133349 A1    May 11, 2017

(30) Foreign Application Priority Data
Nov. 11, 2015    (CN) .......................... 2015 1 1010440

(51) Int. Cl.
*H01L 25/065* (2006.01)
*H01L 25/00* (2006.01)
(Continued)

(52) U.S. Cl.
CPC .......... *H01L 23/5389* (2013.01); *H01L 24/19* (2013.01); *H01L 24/20* (2013.01); *H01L 24/97* (2013.01); *H01L 21/568* (2013.01); *H01L 2224/04105* (2013.01); *H01L 2224/12105* (2013.01); *H01L 2224/32145* (2013.01); *H01L 2224/48091* (2013.01); *H01L 2224/48227* (2013.01); *H01L 2224/73265* (2013.01);
(Continued)

(58) Field of Classification Search
CPC ...................... H01L 24/48; H01L 24/85; H01L 2225/06506; H01L 2225/0651; H01L 2225/1052; H01L 2225/06548; H01L 2224/48247; H01L 2224/73203; H01L 2224/73253; H01L 2224/92247; H01L 2224/85; H01L 2224/73265; H01L 2224/48227; H01L 21/486; H01L 23/49827; H01L 23/5226; H01L 23/5389; H01L 25/0652; H01L 25/0655
See application file for complete search history.

(56) References Cited

U.S. PATENT DOCUMENTS

5,646,828 A * 7/1997 Degani .................. H01L 23/13
                                                    257/707
6,351,028 B1 * 2/2002 Akram ................ H01L 23/3185
                                                    257/686
(Continued)

*Primary Examiner* — David Spalla
(74) *Attorney, Agent, or Firm* — Charles E. Bergere (57) ABSTRACT

A package substrate having an opening and through-substrate interconnect structures is attached to a temporary carrier such as an adhesive film. The active surface of an IC die is placed in contact with the carrier substrate within the opening, to temporarily attach the die to the carrier substrate. Another die is attached to the side of the first die furthest from the carrier substrate. In one embodiment, the dies are attached to each other using an epoxy so that their respective non-active surfaces face each other. Bond wires are connected between interconnects at the active surface of the second die and the substrate. The wires are then encapsulated. After removal of the carrier substrate, a build-up interconnect structure is formed that includes external interconnects of the package substrate, such as solder balls of a ball grid array package.

17 Claims, 7 Drawing Sheets

(51) Int. Cl.
   *H01L 23/538*   (2006.01)
   *H01L 23/00*   (2006.01)
   *H01L 21/56*   (2006.01)

(52) U.S. Cl.
   CPC ............... *H01L 2224/73267* (2013.01); *H01L 2224/85005* (2013.01); *H01L 2224/97* (2013.01); *H01L 2924/15151* (2013.01)

(56) References Cited

U.S. PATENT DOCUMENTS

| | | |
|---|---|---|
| 7,579,690 B2 | 8/2009 | Chia |
| 7,955,953 B2 | 6/2011 | Lo |
| 8,518,746 B2 | 8/2013 | Pagaila |
| 8,669,140 B1 | 3/2014 | Muniandy |
| 2008/0073797 A1* | 3/2008 | Kim .................... H01L 23/5389 257/777 |
| 2010/0059876 A1* | 3/2010 | Shimizu .............. H01L 23/5389 257/700 |
| 2012/0056312 A1* | 3/2012 | Pagaila ................ H01L 21/561 257/684 |
| 2012/0061833 A1* | 3/2012 | Jeong ................. H01L 23/5389 257/738 |

\* cited by examiner

FIG. 20

METHOD OF PACKAGING INTEGRATED CIRCUIT DIE AND DEVICE

BACKGROUND

The present invention relates generally to electronic devices and, more particularly, to packaged electronic devices and methods of assembling packaged electronic devices.

It is often useful to combine multiple microelectronic devices, such as semiconductor die carrying integrated circuits (ICs), microelectromechanical systems (MEMS), optical devices, passive electronic components, and the like, into a single package that is both compact and structurally robust. Packaging of microelectronic devices has traditionally been carried-out using a so-called two dimensional (2D) or non-stacked approach in which two or more microelectronic devices are positioned and interconnected in a side-by-side or laterally adjacent spatial relationship. More particularly, in the case of ICs formed on semiconductor die (IC die), packaging has commonly entailed the mounting of multiple IC dies to a package substrate and the formation of desired electrical connections through wire bonding or flip-chip (FC) connections. The 2D microelectronic package may then later be incorporated into a larger electronic system by mounting the package substrate to a printed circuit board (PCB) or other component included within the electronic system.

As an alternative to 2D packaging technologies of the type described above, three dimensional (3D) packaging technologies have recently been developed in which microelectronic devices are disposed in a stacked arrangement and vertically interconnected to produce a stacked, 3D microelectronic package. Such 3D packaging techniques yield highly compact microelectronic packages well-suited for usage within mobile phones, digital cameras, digital music players, and other compact electronic devices. Additionally, 3D packaging techniques enhance device performance by reducing interconnection length, and thus signal delay, between the packaged microelectronic devices.

Fan-out Wafer Level Packaging (FOWLP) packaging uses build-up processes for package interconnections. For example, a standard RCP (Redistributed Chip Package) flow attaches a IC die to a wafer-level substrate so that a build-up interconnect layer can be formed at the active side of the IC die to provide external interconnects. In the case of 3D structures where a bond wire is required, e.g., a G-cell device, FOWLP does not easily accommodate formation of other types of interconnect structures, such as wirebond structures.

DETAILED DESCRIPTION OF THE DRAWINGS

In accordance with an embodiment of the present disclosure, a substrate having an opening and through-substrate interconnect structures is attached to a temporary carrier such as an adhesive film. The active surface of an IC die is placed in contact with the carrier substrate within the opening, to temporarily attach the IC die to the carrier substrate. This IC die can be referred to as a backside die of the package. Another IC die is attached to the side of the backside die furthest from the carrier substrate. This IC die can be referred to as a topside die because it will be further from the external interconnects of the completed package than is the backside die. According to an embodiment, the two IC die are attached to each other using an epoxy so that their respective non-active surfaces face each other. Wirebonds are formed between the active surface of the second IC die and the package substrate. The bond wires are then encapsulated. After removal of the carrier substrate, a build-up interconnect stack is formed at the backside of the die and package substrate that includes external interconnects of the package substrate, such as solder balls of a ball grid array package. Various embodiments of the present disclosure will be better understood with reference to the figures. Note that features of the various figures that are not directly visible from the particular view of a figure are illustrated as dashed features, unless otherwise stated.

Figure 1:
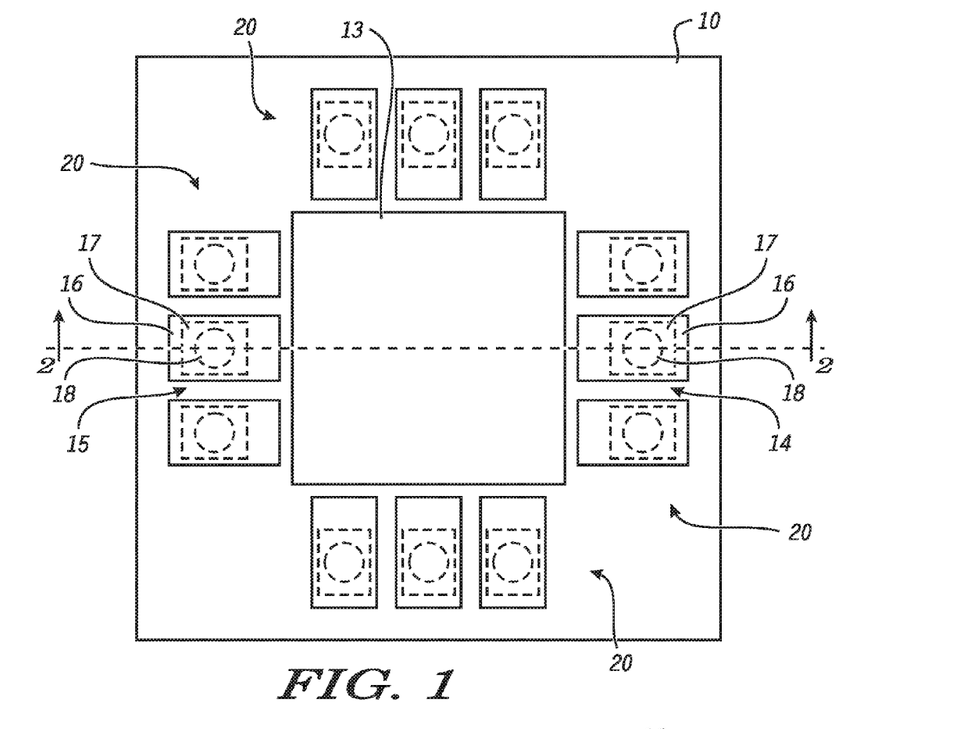
FIG. 1 is a plan view of a package substrate in accordance with an embodiment of the present invention.
Figure 2:
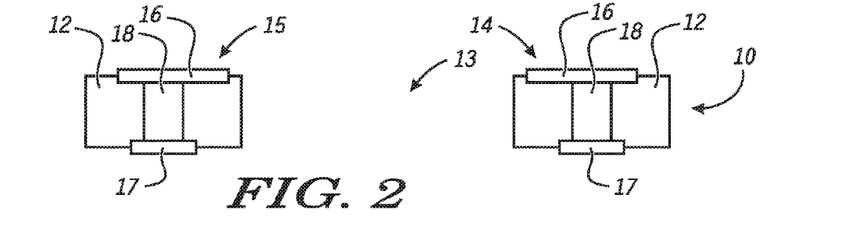
FIG. 2 is a cross-sectional view of a package substrate at a location indicated in FIG. 1.

FIG. 1 illustrates a plan view of a first major-surface of a substrate 10. FIG. 2 illustrates a cross-sectional view of substrate 10 at the location indicated in FIG. 1. Substrate 10 includes a base material 12 that is an electrical insulator and a plurality of electrically conductive interconnects 20. An upper major-surface and a lower major-surface of the substrate 10 are defined by the base material 12 and exposed portions of the conductive interconnects, referred to as external interconnects of the substrate. Note, unless indicated otherwise, that terms "upper" and "lower" in reference to a particular feature refers to the orientation of the feature as illustrated the figure where the particular feature is first illustrated. An opening 13 extends through the substrate 10 that is defined by an inner region of substrate 10. Substrate 10 can be a lamination or a build-up that is based on an organic or ceramic substrate, such as a printed circuit board (PCB), and the like.

The plurality of conductive interconnects 20 include specific interconnects 14 and 15. Each conductive interconnect of the plurality of interconnects 20 includes a portion that defines an upper external interconnect at the upper major-surface, a portion that defines a lower external interconnect at the lower major-surface, and a through-substrate interconnect portion connecting the upper and lower external interconnect portions. For example, at FIG. 2, each of interconnect 14 and interconnect 15 are illustrated to include an upper external interconnect 16, a through-substrate interconnect 18, and a lower external interconnect 17. The through-substrate interconnects are illustrated as Through-Hole-Vias (THVs). It will be appreciated, however, that the through-substrate interconnects can also be routed interconnects passing through one or more routing layers of the substrate, as will be described in greater detail below.

As used herein, the term "external interconnect" when used in reference to a particular structure is intended to refer to a part of the particular structure that provides a conductive interface through which signals can be communicated between the particular structure and other structures. For example, external interconnect 16 of interconnect 14 is that portion of interconnect 14 to which a subsequently provided conductive structure will contact. By way of example, upper external interconnect 16 is presumed to be a bonding pad through which signals can travel to and from the substrate 10 via a subsequently attached bond wire.

Figure 3:
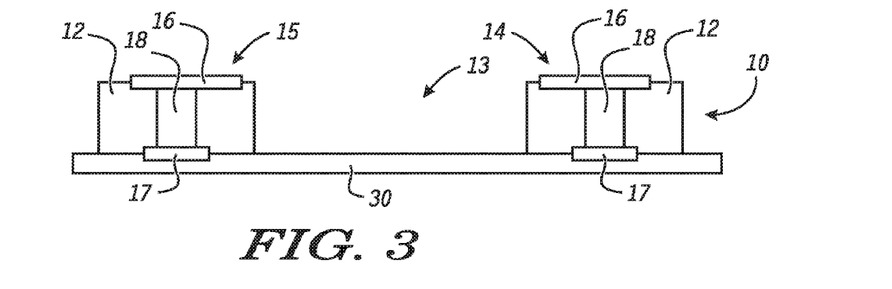
FIG. 3 illustrates a workpiece of FIG. 2 attached to a carrier in accordance with an embodiment of the present invention.

A workpiece is illustrated at FIG. 3 illustrates the substrate 10 after being attached, at its lower major-surface, to a carrier substrate 30. The carrier substrate 30 will be subsequently removed, and is, therefore, a temporary carrier. The carrier substrate 30 can be an adhesive tape, a double sided adhesive tape over a rigid carrier, and the like. In an embodiment, the carrier substrate 30 completely covers the opening 13 and entire substrate. In other embodiments, the carrier substrate can cover only a portion of the opening 13.

Figure 4:
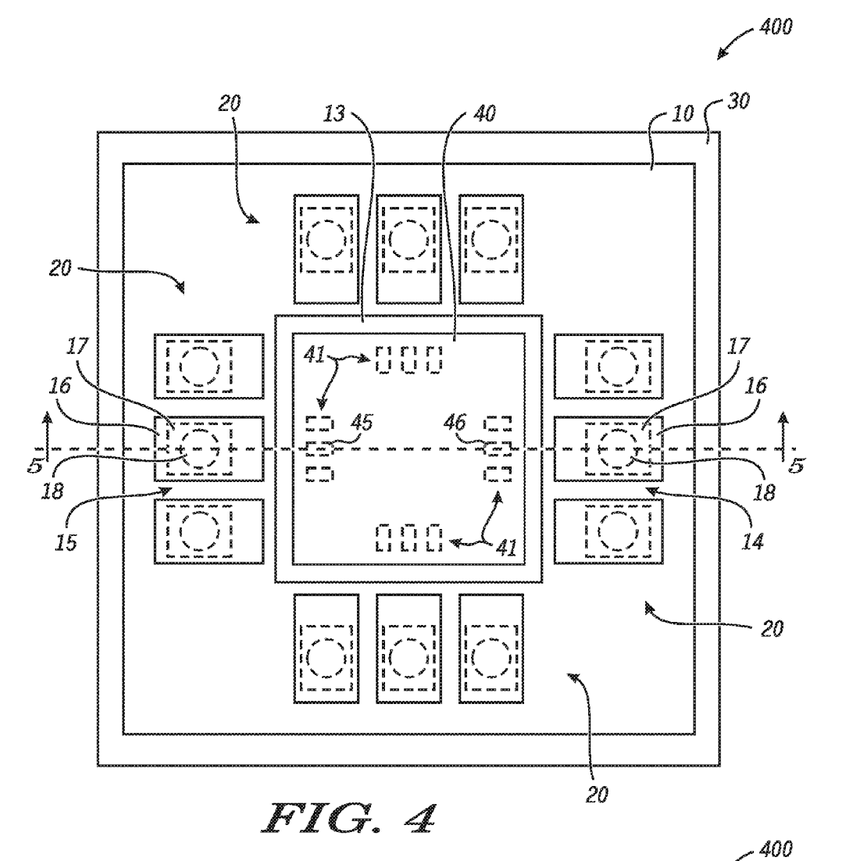
FIG. 4 is a plan view of the workpiece of FIG. 3 having a die attached to the carrier in accordance with an embodiment of the present invention.
Figure 5:
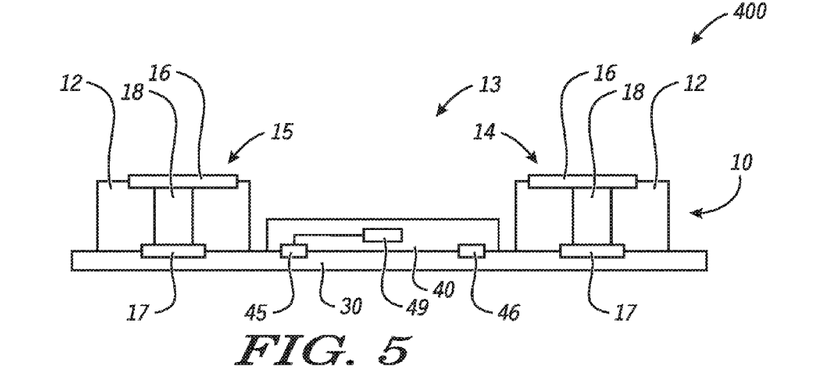
FIG. 5 is a cross-sectional view of the workpiece of FIG. 4.

FIGS. 4 and 5 are plan and cross-sectional views, respectively, of a workpiece 400. The workpiece 400 includes an IC die 40 having an upper and lower major-surface that has been placed within the opening 13. As used herein, the term "within" as used with respect to the placement of a object relative an opening is intended to indicate that from a plan view the object does not extend beyond the perimeter of the opening. The lower major-surface of the IC die 40 includes a plurality of external interconnects 41, including external interconnects 45 and 46, referred to as die pads, which themselves can be bonding pads. The lower major-surface of IC die 40 has been attached to the carrier substrate 30 at an exposed location within the opening 13. The lower major-surface is an active surface of the IC die 40, wherein the term active surface is intended to reference that side of an IC die at which an electronic component 49 has been formed. The electronic component 49 can be an active semiconductor component, such as a transistor or a diode; or a passive device, such as a resistor or capacitor. In the illustrated embodiment, the IC die 40 has one active surface, its lower major surface, and no through-substrate interconnects, though this need not be the case.

Figure 6:
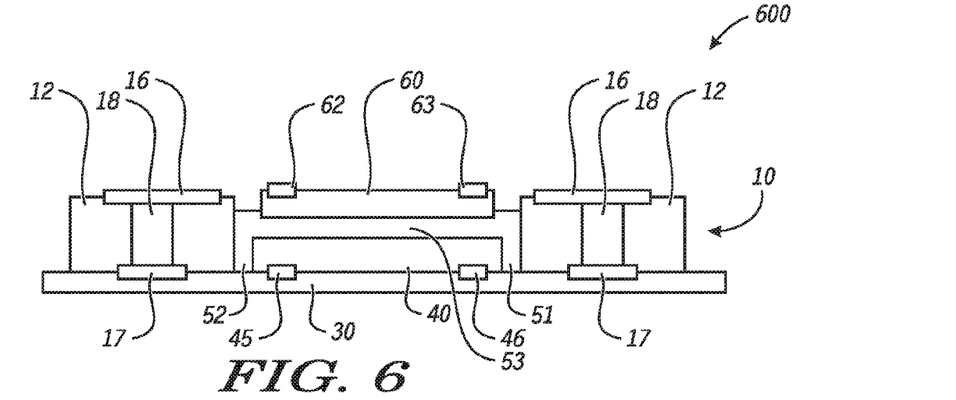
FIG. 6 is a cross-sectional view of the workpiece of FIG. 5 having a second die in accordance with an embodiment of the present invention.

FIG. 6 is a cross-sectional view of a workpiece 600 that includes an IC die 60 having an upper and lower major-surface. In the illustrated embodiment, the upper major-surface of an IC die 60 is an active surface and includes external interconnects 62 and 63, which can be connected to electronic components (not shown), and the lower major-surface is an inactive surface. The IC die 60 has been attached to the IC die 40 by an attach structure 53 so that the inactive surface of die 40 faces the inactive surface of die 60. The attach structure 53 can an epoxy, a die attach film, and the like. In the illustrated embodiment, the upper major-surface and the minor surfaces of IC die 40 are encapsulated in fill material, a portion of which acts as the attached structure 53. For example, the encapsulating fill material includes portion 52 to the left of IC die 40, fill portion 51 to the right of IC die 40, and fill portion 53 over IC die 40, which is also referred to as attach structure 53. The fill material can be epoxy that is deposited during a common deposition process; wherein, IC die 60 is attached to the IC die 40 by placing the lower major-surface of IC die 60 in contact with the epoxy. In another embodiment, the attach structure 53 can be a die attach film placed in contact with the lower major-surface of IC die 60, and the IC die 60/die attach film combination is then attached to the IC die 40 by placing the die attach film over the upper major-surface of IC die 40. It will be appreciated that in the alternative, the die attach film can be first placed in contact with IC die 40.

Figure 7:
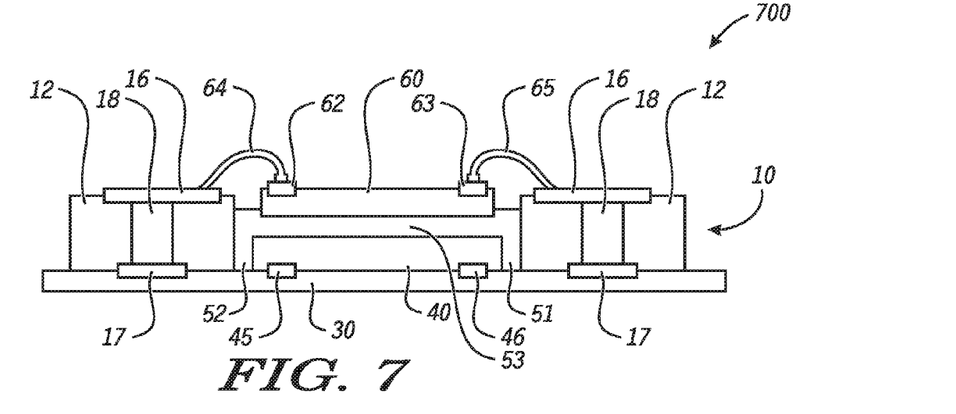
FIG. 7 is a cross-sectional view of the workpiece of FIG. 6 having bond wires in accordance with an embodiment of the present invention.

FIG. 7 is a cross-section view of a workpiece 700 after a bond wire 65 has been connected to external interconnect 16 of interconnect 14 of substrate 10 and to external interconnect 63 of IC die 60 by a wire bonding process, and a bond wire 64 has also been connected to external interconnect 16 of interconnect 15 of the substrate 10 and to the external interconnect 62 of the IC die 60.

Figure 8:
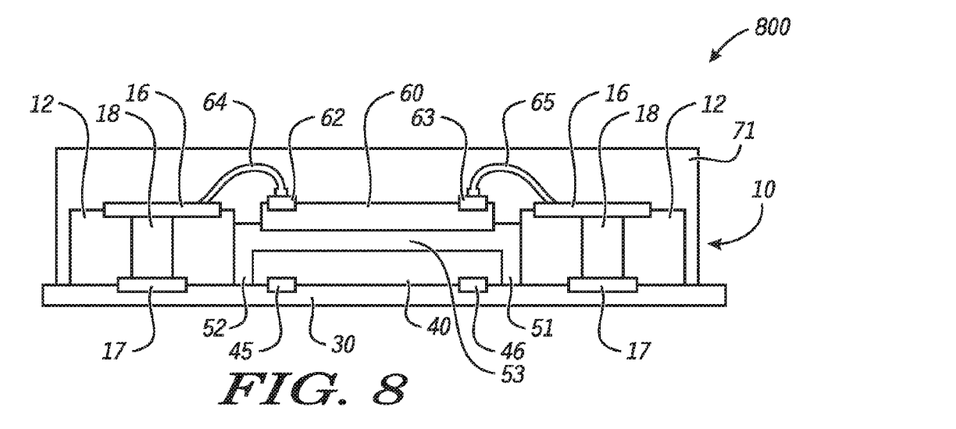
FIG. 8 is a cross-sectional view of the workpiece of FIG. 7 having the bond wires covered in accordance with an embodiment of the present invention.

FIG. 8 is a cross-section view of a workpiece 800 after the upper major-surface of substrate 10, wherein bond wires 64 and 65 have been covered. The surface can be encapsulated by a molding compound to create a structure 71 that defines an outer portion of a packaged device, or cap with a void can be attached. The covering can cover the minor surfaces of the device, or not cover the minor surfaces of the device. The molding compound can include materials such as silica fillers, resin, and the like.

Figure 9:
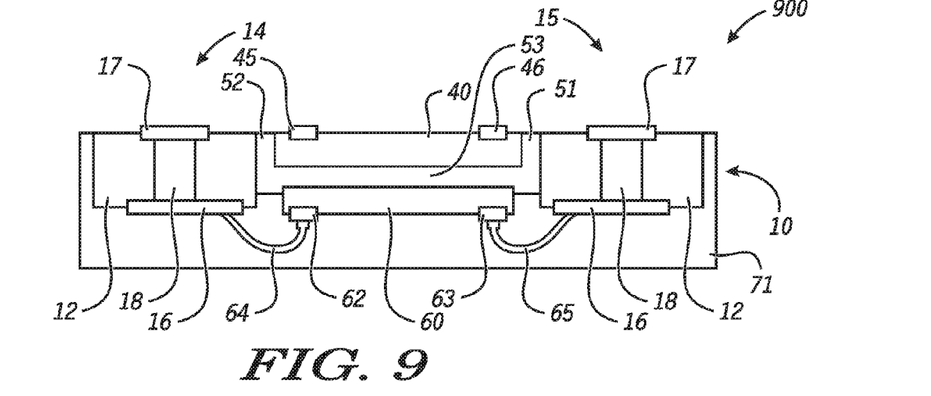
FIG. 9 is a cross-sectional view of the workpiece of FIG. 8 after removing the carrier in accordance with an embodiment of the present invention.

FIG. 9 is a cross-section view of a workpiece 900 after the workpiece 800 has been flipped and the carrier substrate 30 has been removed to expose the active surface of IC die 40. Note the originally referenced orientations of the various surfaces are maintained in the following discussions.

Figure 10:
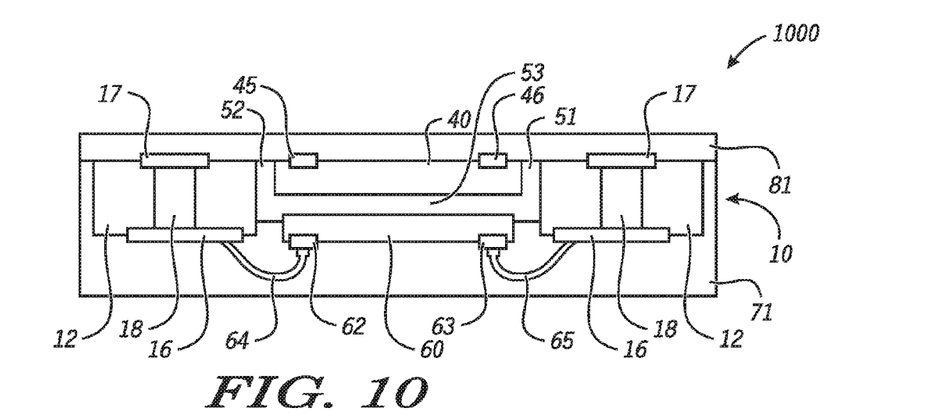
FIG. 10 is a cross-sectional view of the workpiece of FIG. 9 having a patterned dielectric layer overlying a major surface in accordance with an embodiment of the present invention.

FIGS. 10 through 14 illustrate a particular embodiment of a build-up process to form interconnects that include external interconnects of the completed package. FIG. 10 is a cross-section view of a workpiece 1000 after the formation of layer 81 at the surface of the previous workpiece. Layer 81 is an insulator layer that resides at a particular level over the lower surfaces of the substrate 10 and IC die 40. Therefore, layer 81 overlies the two external interconnects 17 of the substrate 10, and the external interconnects 45 and 46 of IC die 40. Layer 81 can be formed by spin coating with epoxy, polyimide, benzo-cyclobutene (BCB), lamination processes with dry film materials, and the like.

Figure 11:
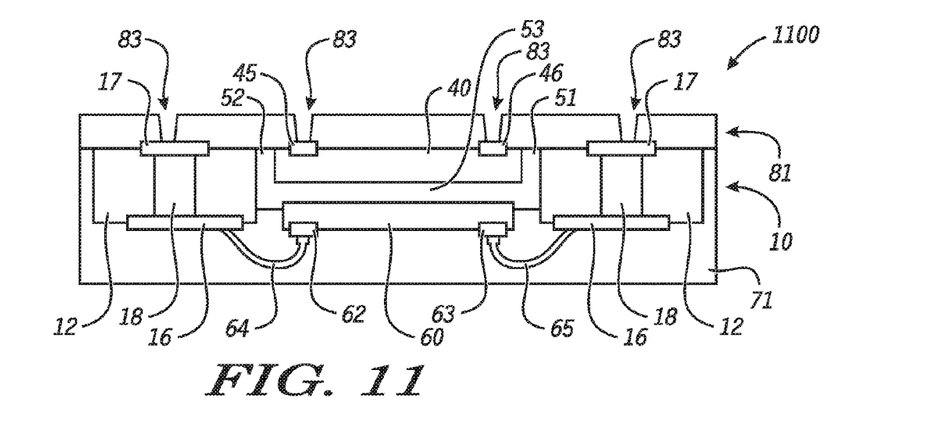
FIG. 11 is a cross-sectional view of the workpiece of FIG. 9 having a patterned dielectric layer overlying a major surface in accordance with an embodiment of the present invention.

FIG. 11 is a cross-section view of a workpiece 1100 after layer 81 has been patterned using conventional or proprietary techniques, such as photolithography, laser ablation, and the like, to form openings 83 that expose external interconnects at the substrate 10 and the IC die 40.

Figure 12:
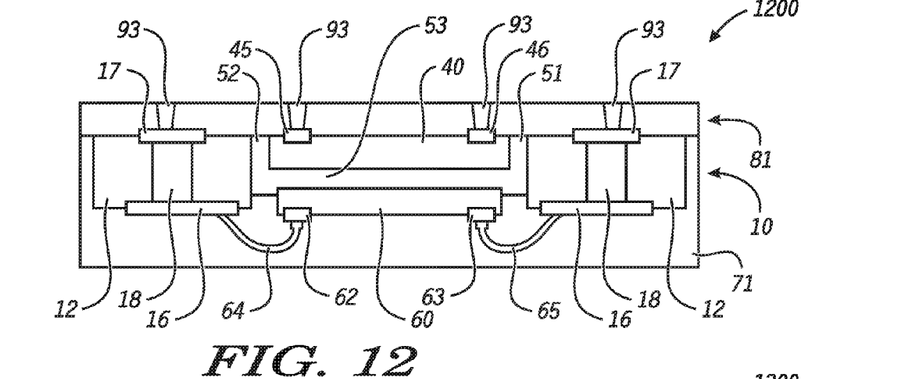
FIG. 12 is a cross-sectional view of the workpiece of FIG. 11 having conductive vias in accordance with an embodiment of the present invention.

FIG. 12 is a cross-section view of a workpiece 1200 after formation of a conductive contact 93, also referred to as a via, in each of the openings 83. The contacts 93 can be formed using conventional or proprietary techniques, and can include a metal, barrier layers between the metal and other features, and the like.

Figure 13:
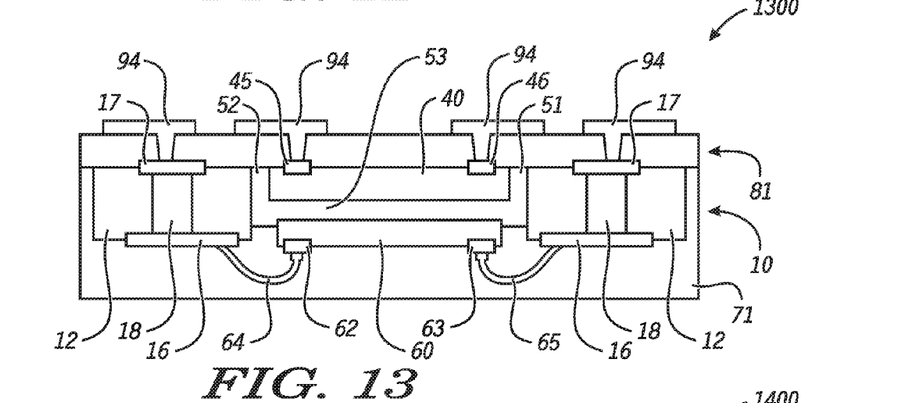
FIG. 13 is a cross-sectional view of the workpiece of FIG. 12 having conductive pads in accordance with an embodiment of the present invention.

FIG. 13 is a cross-section view of a workpiece 1300 after formation of conductive structure 94, e.g. a RDL (Redistribution Layer), at which an external interconnect of the package will be subsequently formed. According to an embodiment, the conductive structure 94 can include a metal, a conductive epoxy material, and the like; and can be formed by plating, printing, disposing processes, and the like. A barrier layer may be included depending on the specific process that is used. The RDL process may include sputtered barrier layer, photo, plating and etching processes. RDL metal can be Cu, Cu alloy, Ti or other materials. Barrier layer can be Ti, TiW or other metal materials. Additional RDL may be included by reiterating insulation layer and RDL processes if required. It will be appreciated, that the conductive inter-level contact 93, and the conductive structure 94 can also be formed during a common process, such as a plating process.

Figure 14:
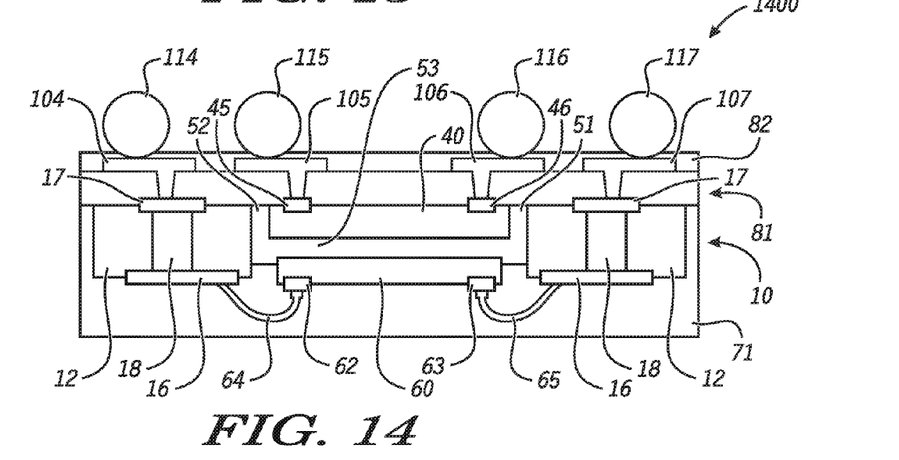
FIG. 14 is a cross-sectional view of the workpiece of FIG. 13 having external interconnects in accordance with an embodiment of the present invention.

FIG. 14 is a cross-section view of workpiece 1400 after formation of external interconnects 114-117 at the conductive structures 94. The external interconnects 114-117 can be conductive balls that are formed by attaching conductive structures 94 using a solder process through openings in a patterned an insulator layer 82, by depositing one or more conductive layers at the opening, and the like.

In the forgoing figures, various embodiments have been described with reference to specific examples of embodiments of the invention. It will, however, be evident that various modifications and changes may be made therein without departing from the broader spirit and scope of the invention as set forth in the appended claims. The following figures illustrate various additional embodiments.

Figure 15:
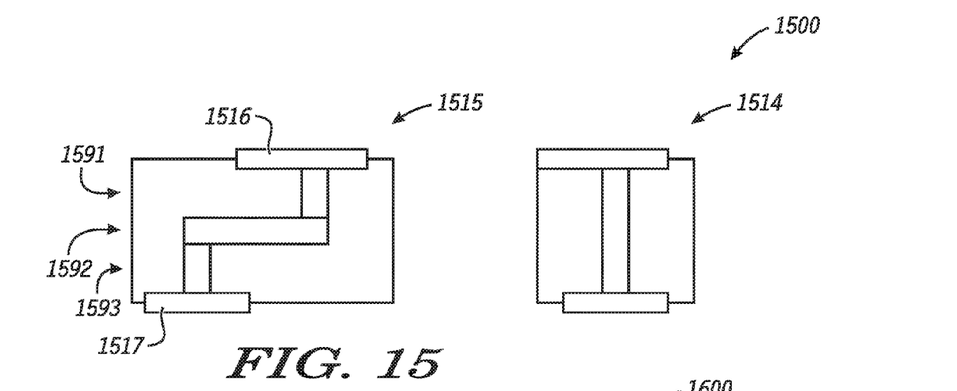
FIG. 15 is a cross-sectional view of a package substrate in accordance with an embodiment of the present invention.

The through-substrate interconnects 20 in the previous drawings have been illustrated to be TSVs, which are vertical connections from major surface to major surface. FIG. 15 illustrates an alternate embodiment of substrate 1500 having through-substrate interconnect 1514, which is a TSV, and a through substrate interconnect 1515 that is referred to as a "routed through-substrate interconnect" by virtue of having horizontal routing at through an insulator at layer 1592 of the substrate 1500 that connects to external interconnects 1516 and 1517 by separate vias through insulators at layers 1591 and 1593, respectively. Each of layers 1591-1593 can be referred to as via layers, which are insulator layers through which vias primarily pass. Layer 1592 can be referred to as a routing layer, which is an insulator layer through which a conductive path perpendicular to the vias is formed. Thus, a conductive path is formed between external interconnect 1516 and 1517. While substrate 1500 is shown to have a single routing layer, in other embodiments, multiple routing layers can be used.

Figure 16:
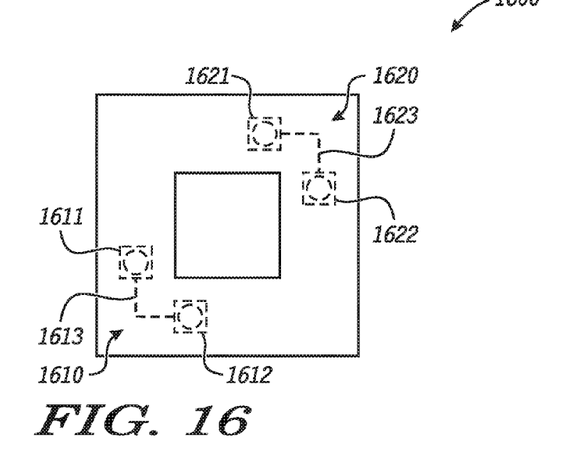
FIG. 16 is a plan view of a package substrate in accordance with an embodiment of the present invention.

A particular embodiment of a substrate can have only through-substrate interconnects, such as have been previously illustrated. In an alternate embodiment, the substrate can also included substrate interconnects that provide a conductive path between two external interconnects at the same major surface of the substrate. For example, referring to FIG. 16, which is a plan view of a substrate 1600, an interconnect 1610 has two external interconnects 1611 and 1612 at the upper surface of the substrate, as indicated by the solid line representing the external interconnects, two vias, represented by the dashed circles within the interconnects 1611 and 1612, and a horizontal interconnect represented by dashed line 1613. FIG. 16, also illustrates an interconnect 1620 of substrate 1600 that has two external interconnects 1621 and 1622 at the lower surface of the substrate, as indicated by the dotted line representing the external interconnects, two vias, represented by the dashed circles within the interconnects 1621 and 1622, and a horizontal interconnect represented by dashed line 1623.

Figure 17:
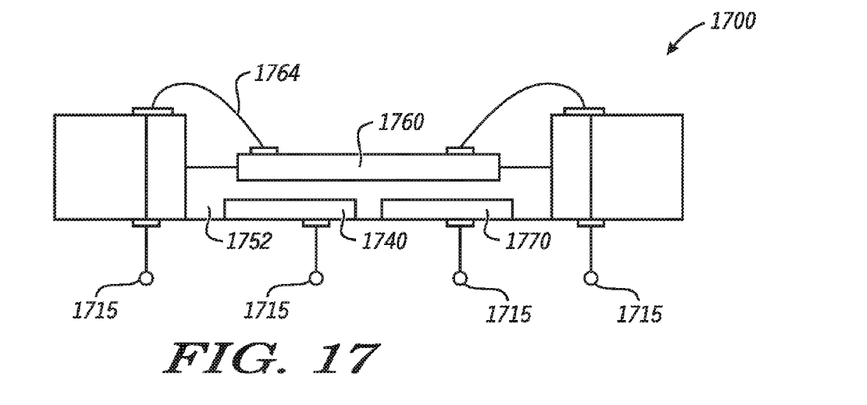
FIG. 17 is a cross-sectional view of a workpiece having multiple die at a common level in accordance with an embodiment of the present invention.

FIG. 17 illustrates a simplified drawing including only relevant portions 1700 of the package device for the purpose of illustrated the use of multiple IC die at a die level nearest the external interconnects 1715 of the package. Thus, instead of a single IC die being placed in contact with the carrier, as described at FIG. 5, multiple IC die, 1740 and 1770, are placed in contact with the carrier. A subsequent IC die 1760 is attached, wirebonds 1764 are formed, and the build-up layer is formed, which includes the external interconnects 1715. Fill material 1752 is also illustrated, which is analogous to the fill material 52 of FIG. 6.

Figure 18:
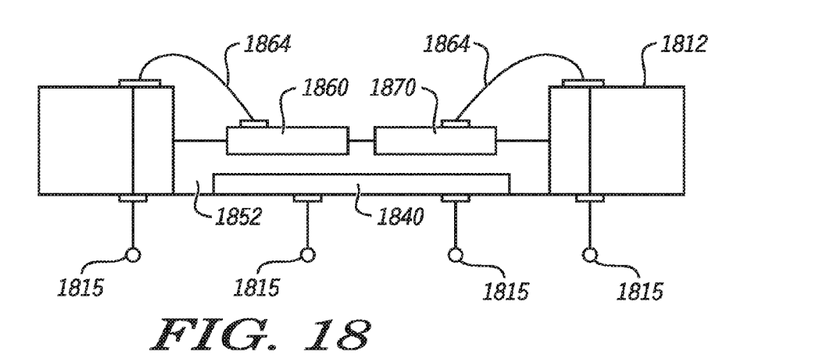
FIG. 18 is a cross-sectional view of a workpiece including multiple die at a common level in accordance with an embodiment of the present invention.

FIG. 18 illustrates a simplified drawing including only relevant portions 1800 of the package device for the purpose of illustrated the use of multiple IC die at a die level furthest the external interconnects 1815 of the package. Thus, instead of a single IC die being attached to the IC die 1840, as described at FIG. 6, multiple IC die, 1860 and 1870, are attached to the IC die 1840. Wirebonds 1864 are formed, and the build-up layer is formed, which includes the external interconnects 1815. Fill material 1852 is also illustrated, which is analogous to the fill material 52 of FIG. 6.

Figure 19:
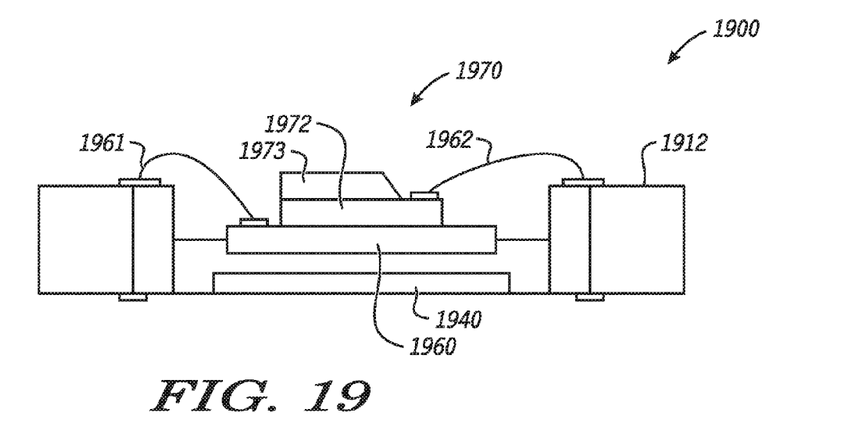
FIG. 19 is a cross-sectional view of workpiece including a stacked die in accordance with an embodiment of the present invention.

FIG. 19 illustrates a particular embodiment 1900, wherein a stacked die module, such as a G-Cell that can detect acceleration, is provided and attached to the IC die 1940, which is in contact with the carrier (FIG. 5). The particular stacked IC die module 1970 includes a base IC die 1960, an overlying IC die 1972, and a cap 1973 over a portion of the overlying IC die 1972. In the illustrated embodiment, the upper major surface of both IC die 1960 and IC die 1972 are active surfaces having external interconnects that are wire bonded to the substrate 1912 and that are electrically connected to electronic components of their respective IC dies (not shown).

In one embodiment, the die module 1970 is a die stack is formed by a wafer-level process prior to being placed in the opening. For example, cap 1973 can be attached to the die 1972 during a wafer level process, such as before die 1972 is singulated from a wafer, and can be hermetically, or otherwise, attached. After singulation, the capped die 1972/1973, which can include MEMS (Micro-Electro-Mechanical Systems) devices, such as can be used to detect acceleration, can be attached to an application specific die 1960 that when electrically interfaced with the capped die 1972/1973 implements a MEMs-based device supporting a specific set of features, such as an accelerometer.

It will be appreciated that when a die stack is provided for placement into the present package, that the physical connection between the die 1960 and the die 1972 will typically be of a different-type than the physical connection between die 1940 and 1960. According to an embodiment, a die module processed by a wafer level process can have a bonding interface between die cap 1973 and die 1972, and between die 1972 and 1960 having a thickness in the range of 2-10 micro-meters, while the thickness of the bonding interface between die 1940 and die 1960 will be significantly thicker. For example, the thickness of the bonding interface between 1940 and 1960 can be in the range of 10 to 25 micro-meters. Thus, the ratio of the two thicknesses can be in the range of 2:1 to 10:1. In addition, different materials can be used to attach the two die sets, respectively, as well as different processes which can result in different physical characteristics. In an alternate embodiment, the capped die 1972/1973 can be provided separate from the application specific die 1960 and instead attached to the die 1960 as part the disclosed packaging process. Thus attaching die stack 1972/1973 to die 1960 after attaching die stack 1960 to die 1940. Alternatively, the capped die 1972/1973 can be attached to the die 1940, e.g., no die 1960 is used, to electrically connect a MEMS cell with its application specific die, thus making a packed G-Cell device using the present technique.

In an alternate embodiment, a bond wire can be connected between the active surface of die 1972 and die 1960 during the wire bonding process that attaches the die to the substrate 1912.

In the foregoing specification, the invention has been described with reference to specific examples of embodiments of the invention. It will, however, be evident that various modifications and changes may be made therein without departing from the broader scope of the invention as set forth in the appended claims, and that the claims are not limited to the specific examples described.

Some of the above embodiments, as applicable, may be implemented using a variety of different circuitry components. For example, the exemplary topology in the figures and the discussion thereof is presented merely to provide a useful reference in discussing various aspects of the invention. Of course, the description of the topology has been simplified for purposes of discussion, and it is just one of many different types of appropriate topologies that may be used in accordance with the invention. Thus, for example, it will be appreciated that the various die illustrated herein can have varying thicknesses.

Figure 20:
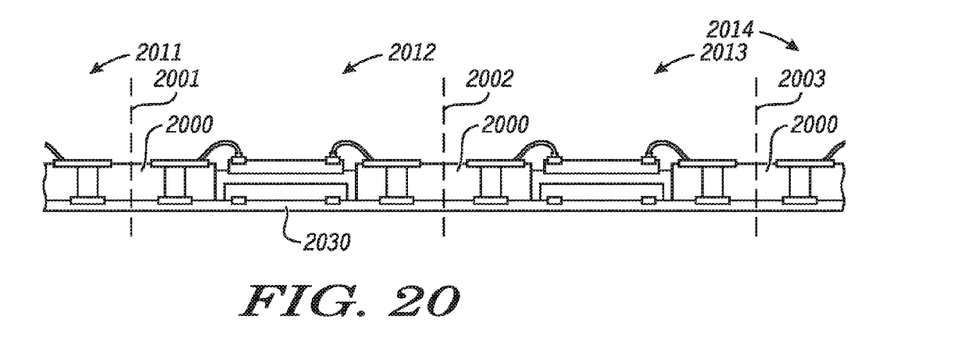
FIG. 20 illustrates a panel having multiple package substrates in accordance with an embodiment of the present invention.

For example, instead of processing substrates individually, the packages can be manufactured at a panel-level as illustrated at FIG. 20. FIG. 20 is a cross-section view showing a plurality of packages being assembled at substrate locations 2011-2014 of a panel prior to their being singulated from each other. It will be appreciated that FIG. 20 is analogous to the same process location as that described with reference to FIG. 7. After processing is completed, the substrate location 2011-2014 will be singulated from each other along the dashed lines 2001-2003 to form individual packages. This process leaves a portion of the substrate 2000 exposed along the minor surfaces of the final package due to the singulation process.

Skilled artisans will appreciate that elements in the figures are illustrated for simplicity and clarity and have not necessarily drawn to scale. For example, the chosen elements are only used to help to improve the understanding of the functionality and the arrangements of these elements in various embodiments of the present invention. Also, common but well understood elements that are useful or necessary in a commercial feasible embodiment are mostly not depicted in order to facilitate a less abstracted view of these various embodiments of the present invention. It will further be appreciated that certain actions and/or steps in the described method may be described or depicted in a particular order of occurrences while those skilled in the art will understand that such specificity with respect to sequence is not actually required. It will also be understood that the terms and expressions used in the present specification have the ordinary meaning as it accorded to such terms and expressions with respect to their corresponding respective areas of inquiry and study except where specific meanings have otherwise be set forth herein.

The invention claimed is:

1. A method of forming an integrated circuit package, comprising:

attaching a first major surface of a substrate to a carrier, the substrate including first and second major surfaces, a first dielectric layer between the first and second major surfaces, a first region defining a first opening, and a first interconnect having a first external portion at the first major surface, a second external portion at the second major surface, and a middle portion through the first dielectric layer that electrically connects the first external portion to the second external portion, wherein an exposed portion of the carrier is exposed within the first opening of the first region of the substrate;

attaching a first major surface of a first integrated circuit (IC) die to the exposed portion of the carrier, wherein the first IC die has first and second major surfaces, and an interconnect including an external portion at the first major surface thereof and an internal portion connected to an electronic component of the first integrated circuit die, and wherein the first major surface of the first IC die is coplanar with the first major surface of the substrate;

securing a second IC die to the first IC die, wherein the second major surface of the first IC die faces a second major surface of the second IC die, the second IC die having first and second major surfaces, and an interconnect including an external portion at its first major surface electrically connected to an electronic component of the second IC die, such that the first and second IC dies are arranged back-to-back, and wherein the first major surface of the second IC die and the second major surface of the substrate are not coplanar;

connecting a first wire to the external portion of the interconnect of the second IC die and to the second external portion of the first interconnect of the substrate;

covering the first wire, the first major surface of the second IC die and the second major surface of the substrate with a molding compound;

removing the carrier from the first major surface of the substrate, wherein the first major surface of the first IC die is coplanar to the first major surface of the substrate when the carrier is removed;

forming a second dielectric layer at the first major surface of the substrate;

forming through the second dielectric layer a first interconnect that is electrically connected to the first external portion of the first interconnect of the substrate;

forming a first external interconnect of the IC package electrically connected to the first interconnect of the second dielectric layer through the second dielectric layer;

forming through the second dielectric layer a second interconnect that is electrically connected to the external portion of the interconnect of the first IC die; and forming a second external interconnect of the IC package electrically connected to the second interconnect through the second dielectric layer.

2. The method of claim 1, wherein securing the first IC die includes placing the first and second IC dies in contact with a die attach film.

3. The method of claim 1, wherein securing the first IC die includes placing the first and second IC dies in contact with an epoxy.

4. The method of claim 1, further comprising:
attaching a first major surface of a third IC die to the exposed portion of the carrier and adjacent to the first IC die, the third IC die having first and second major surfaces, and an interconnect including an external portion at its first major surface and an internal portion connected to an electronic component of the third IC die.

5. The method of claim 1, wherein the substrate further includes a second interconnect having a third external portion at the substrate first major surface, a fourth external portion at the substrate second major surface, and a portion through the first dielectric layer that electrically connects the third external portion to the fourth external portion, the method further comprising:
securing a third IC die to the first IC die and adjacent to the second IC die, the third IC die having first and second major surfaces, and an interconnect including an external portion at its first major surface and an internal portion connected to an electronic component of the third IC die, wherein, when secured, the second major surfaces of the second and third IC die are attached to the second major surface of the first IC die; and
connecting a second wire to the external portion of the interconnect of the third IC die and to the fourth external portion of the interconnect of the substrate.

6. The method of claim 1, wherein the second IC die is part of a stacked die module that includes a third IC die secured to the second die.

7. The method of claim 6, wherein:
the stacked die module includes a cap secured to a first major surface of the third IC die, the third IC die having an interconnect including an external portion at its first major surface;
the substrate further includes a second interconnect having a third external portion at the substrate first major surface, a fourth external portion at the substrate second major surface, and a portion through the first dielectric layer that electrically connects the third external portion to the fourth external portion, the method further comprising:
connecting a second wire to the external portion of the interconnect of the third IC die and to the fourth external portion of the interconnect of the package substrate.

8. The method of claim 6, wherein the stacked die module includes a cap secured to a first major surface of the third IC die, the third IC die having an interconnect including an external portion at its first major surface, the method further comprising:
connecting a second wire to the external portion of the interconnect of the third IC die and to a location on the second IC die.

9. An integrated circuit (IC) package, comprising:
a plurality of external interconnects at a first major surface of the package;
a first substrate having a first major surface and a second major surface, the first major surface having a first external interconnect, the second major surface having a second external interconnect electrically connected to the first external interconnect by a first conductive path through an insulator layer of the first substrate, wherein a region of the first substrate defines an opening through the substrate;
a first IC die disposed within the opening having a first major surface, co-planar with the first major surface of the first substrate, wherein the first IC die includes an external interconnect on its first major surface, and internal circuitry that is electrically connected to the external interconnect;
a build-up interconnect stack that includes first and second conductive paths through a routing layer and through a dielectric/via layer, the first conductive path electrically connected to the external interconnect of the first IC die and to a first external interconnect of the package, and the second conductive path electrically connected to the first external interconnect of the substrate and to a second external interconnect of the package;
a second IC die having a first major surface, a second major surface, and a semiconductor component that is proximate to the first major surface, the second major surface facing the second major surface of the first IC die such that the first and second IC dies are back-to-back, wherein the first major surface has an external interconnect that is electrically connected to the semiconductor component of the second IC die, and wherein the first major surface of the second IC die and the second major surface of the substrate are not coplanar;
a first wire connected to the external interconnect of the second IC die, and to the second external interconnect of the substrate; and
a molding compound that covers the first wire, the first major surface of the second IC die, and the second major surface of the substrate.

10. The package of claim 9, wherein:
a third IC die having a first major surface, a second major surface, and an active semiconductor component that is proximate to the first major surface, the second major surface facing the first major surface of the second IC die, the first major surface having an external interconnect that is electrically connected to the active semiconductor component;
the first major surface of the first substrate further includes a third external interconnect; the second major surface of the first substrate further includes a fourth external interconnect electrically connected to the third external interconnect by a second conductive path through the insulator layer of the first substrate;
the build-up interconnect stack further includes a third conductive path through the routing layer and dielectric/via layer, wherein the third conductive path is electrically connected to the third external interconnect of the first substrate and to a third external interconnect of the plurality of external interconnects of the package; and
a second wire connected to the external interconnect of the third IC die, and to the fourth external interconnect of the substrate.

11. The package of claim 10, wherein the third IC die is a capped die.

12. The package of claim 9, further comprising:
a third IC die having a first major surface, co-planar with the first major surface of the first substrate, that includes an external interconnect, and an active semiconductor component that is proximate to the first major surface and that is electrically connected to the external interconnect;
wherein the build-up interconnect stack further includes a third conductive path through the routing layer and dielectric/via layer, the third conductive path electrically connected to the external interconnect of the third IC die and to a third external interconnect of the plurality of external interconnects of the package.

13. The package of claim 9, further comprising:
a third IC die having a first major surface coplanar with the first major surface of the second IC die, a second major surface, and an active semiconductor component that is proximate to the first major surface, the second major surface facing the second major surface of the first die such that the first and third IC dies are back-to-back, the first major surface having an external interconnect that is electrically connected to the active semiconductor component;
the first major surface of the first substrate further includes a third external interconnect, and the second major surface of the first substrate further includes a fourth external interconnect electrically connected to the third external interconnect by a second conductive path through the insulator layer of the first substrate;
the build-up interconnect stack further includes a third conductive path through the routing layer and dielectric/via layer, wherein the third conductive path is electrically connected to the external interconnect of the third IC die and to a third external interconnect of the plurality of interconnects of the package; and
a second wire connected to the external interconnect of the third IC die and to the fourth external interconnect of the substrate.

14. The package of claim 9, wherein all of the external interconnects of the first major surface of the substrate are electrically connected to external interconnects of the second major surface of the substrate by through vias.

15. The package of claim 9, wherein at least some of the external interconnects of the first major surface of the substrate are electrically connected to external interconnects of the second major surface through a first level routing layer and two vias.

16. A method of forming an integrated circuit package, comprising:
attaching a first major surface of a panel to a carrier, the panel having the first major surface, a second major surface, a dielectric layer between the first and second major surfaces, and a plurality of substrate locations;
each substrate location of the plurality of substrate locations comprising a first region defining an opening, and a first interconnect having a first external portion at the first major surface, a second external portion at the second major surface, and a portion through the dielectric layer that electrically connects the first external portion to the second external portion, wherein an exposed portion of the carrier is exposed within the opening;
attaching a first major surface of a first integrated circuit (IC) die to the exposed portion of the carrier at the opening of a first substrate location of the plurality of substrate locations, the first IC die having the first major surface, a second major surface, and an interconnect including an external portion at the first major surface and an internal portion connected to an electronic component of the first IC die;
attaching a first major surface of a second integrated circuit (IC) die to the exposed portion of the carrier at the opening of a second substrate location of the plurality of substrate locations, the second IC die having the first major surface, a second major surface, and an interconnect including an external portion at the first major surface and an internal portion connected to an electronic component of the second integrated circuit die;
securing a third IC die to the first IC die, wherein the second major surface of the first IC die faces a second major surface of the third IC die such that the first and third IC dies are back-to-back, the third IC die having a first major surface, the second major surface, and an interconnect including an external portion at the first major surface electrically connected to an electronic component of the third IC die;
securing a fourth IC die to the second IC die, wherein the second major surface of the second IC die faces a second major surface of the fourth IC die such that the second and fourth IC dies are back-to-back, the fourth IC die having a first major surface, the second major surface, and an interconnect including an external portion at the first major surface electrically connected to an electronic component of the fourth IC die, and wherein the first major surfaces of the third and fourth IC dies are not coplanar with the second major surface of the substrate;
connecting a first wire to the external portion of the interconnect of the third IC die and to the second external portion of the first interconnect of the first substrate location, and connecting a second wire to the external portion of the fourth IC die and to the second external portion of the first interconnect of the second substrate location;
covering the first and second wires, the first major surfaces of the third and fourth IC dies, and the second major surface of the substrate with a molding compound;
removing the carrier from the panel, wherein the first major surfaces of the first IC die and of the second IC die are coplanar to the first major surface of the panel when the carrier is removed;
forming a second dielectric layer at the first major surface of the panel;
forming through the second dielectric layer a first interconnect that is electrically connected to the first external portion of the first interconnect of the first substrate location, and a second interconnect that is electrically connected to the first external portion of the first interconnect of the second substrate location; and
forming a first external interconnect of the IC package electrically connected to the first interconnect through the second dielectric layer at the first substrate location, and a second external interconnect of the IC package electrically connected to the second interconnect through the second dielectric layer at the second substrate location.

17. The method of claim 16, further comprising:
forming through the second dielectric layer a third interconnect that is electrically connected to the external portion of the interconnect of the first IC die;

forming a third external interconnect of the IC package electrically connected to the third interconnect through the second dielectric layer;

forming through the second dielectric layer a fourth interconnect that is electrically connected to the external portion of the interconnect of the second IC die; and forming a fourth external interconnect of the IC package electrically connected to the fourth interconnect through the dielectric layer.

* * * * *